(12) United States Patent
Funakawa et al.

(10) Patent No.: US 8,581,669 B2
(45) Date of Patent: Nov. 12, 2013

(54) VIBRATOR ELEMENT, VIBRATOR, OSCILLATOR, AND ELECTRONIC APPARATUS

(75) Inventors: Takeo Funakawa, Chino (JP); Takashi Yamazaki, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/363,475

(22) Filed: Feb. 1, 2012

(65) Prior Publication Data

US 2012/0194283 A1  Aug. 2, 2012

(30) Foreign Application Priority Data

Feb. 2, 2011 (JP) .................................. 2011-020413
Sep. 13, 2011 (JP) .................................. 2011-199121

(51) Int. Cl.
*H01L 41/22* (2013.01)

(52) U.S. Cl.
USPC ......................................... 331/156; 310/348

(58) Field of Classification Search
USPC .......... 331/156, 158; 29/25.35; 310/370, 344; 333/200
See application file for complete search history.

(56) References Cited

U.S. PATENT DOCUMENTS

| 5,265,315 | A * | 11/1993 | Hoisington et al. ......... 29/25.35 |
| 2002/0089386 | A1 | 7/2002 | Kitamura et al. |
| 2002/0113527 | A1 | 8/2002 | Kawashima |
| 2008/0105052 | A1 | 5/2008 | Takahashi et al. |
| 2009/0178260 | A1 | 7/2009 | Yamazaki et al. |
| 2009/0206704 | A1 | 8/2009 | Kitamura |
| 2010/0201223 | A1 | 8/2010 | Ishii et al. |
| 2010/0244973 | A1 | 9/2010 | Furuhata et al. |
| 2010/0244989 | A1 | 9/2010 | Furuhata et al. |
| 2010/0320875 | A1 | 12/2010 | Takizawa |
| 2011/0057549 | A1 | 3/2011 | Kawai et al. |
| 2011/0080070 | A1 | 4/2011 | Furuhata et al. |
| 2011/0134059 | A1 * | 6/2011 | Paleczny et al. ............... 345/173 |
| 2011/0156826 | A1 | 6/2011 | Kawai |
| 2011/0156827 | A1 | 6/2011 | Kawai |
| 2011/0187470 | A1 | 8/2011 | Yamada |
| 2011/0227661 | A1 * | 9/2011 | Numata et al. ................. 331/158 |

FOREIGN PATENT DOCUMENTS

| JP | 02-032229 | 2/1990 |
| JP | 2001-196891 | 7/2001 |
| JP | 2002-204141 | 7/2002 |
| JP | 2002-261575 | 9/2002 |
| JP | 2004-260249 | 9/2004 |

(Continued)

OTHER PUBLICATIONS

Roszhart, T.V., "The Effect of Thermoelastic Internal Friction on the Q of Micromachined Silicon Resonators", Solid-State Sensor and Actuator Workshop, 4th Technical Digest, IEEE, Kearfott Guidance and Navigation Corporation, Little Falls, NJ, (Jun. 1990), pp. 13-16.

*Primary Examiner* — Joseph Chang
(74) *Attorney, Agent, or Firm* — Harness, Dickey & Pierce, P.L.C.

(57) ABSTRACT

A vibrator element includes a base section, vibration arms, and excitation electrodes provided to the respective vibration arms, the excitation electrodes each include a first electrode disposed on a principal surface side of the vibration arm, a second electrode disposed so as to be opposed to the first electrode, and a piezoelectric body extending between the first electrode and the second electrode, and ITO is used as at least one of the first electrode and the second electrode.

16 Claims, 6 Drawing Sheets

(56) References Cited

FOREIGN PATENT DOCUMENTS

| | | |
|---|---|---|
| JP | 2005-151423 | 6/2005 |
| JP | 2005-318365 | 11/2005 |
| JP | 2005-331485 | 12/2005 |
| JP | 2008-011348 | 1/2008 |
| JP | 2008-096138 | 4/2008 |
| JP | 2008-224628 | 9/2008 |
| JP | 2008-224630 | 9/2008 |
| JP | 2009-005022 | 1/2009 |
| JP | 2009-005023 | 1/2009 |
| JP | 2009-005024 | 1/2009 |
| JP | 2009-118217 | 5/2009 |
| JP | 2009-171118 | 7/2009 |
| JP | 2009-200706 | 9/2009 |
| JP | 2009-239860 | 10/2009 |
| JP | 2010-028535 | 2/2010 |
| JP | 2010-028536 | 2/2010 |
| JP | 2010-103805 | 5/2010 |
| JP | 2010-187059 | 8/2010 |
| JP | 2010-187195 | 8/2010 |
| JP | 2010-187196 | 8/2010 |
| JP | 2010-187197 | 8/2010 |
| JP | 2010-193331 | 9/2010 |
| JP | 2010-226608 | 10/2010 |
| JP | 2010-226609 | 10/2010 |
| JP | 2010-252302 | 11/2010 |
| JP | 2010-252303 | 11/2010 |
| JP | 2011-004035 | 1/2011 |
| JP | 2011-082782 | 4/2011 |
| JP | 2011-082945 | 4/2011 |
| JP | 2011-087154 | 4/2011 |
| JP | 2011-097562 | 5/2011 |
| JP | 2011-155628 | 8/2011 |
| JP | 2011-155629 | 8/2011 |
| JP | 2011-160250 | 8/2011 |
| JP | 2011-191091 | 9/2011 |
| JP | 2011-199453 | 10/2011 |
| JP | 2011-199454 | 10/2011 |
| JP | 2011-199661 | 10/2011 |
| JP | 2011-223371 | 11/2011 |
| JP | 2011-223435 | 11/2011 |
| JP | 2011-223489 | 11/2011 |
| JP | 2011-228922 | 11/2011 |
| JP | 2011-228980 | 11/2011 |
| JP | 2011-232264 | 11/2011 |
| JP | 2011-234072 | 11/2011 |
| WO | 00-44092 | 7/2000 |

* cited by examiner

| No. CONSTITUENT | FIRST ELECTRODE | INSULATING BODY A | PIEZOELECTRIC BODY | INSULATING BODY B | SECOND ELECTRODE | Q-VALUE | DETERMINATION OF COMPARISON WITH CONVENTIONAL STRUCTURE |
|---|---|---|---|---|---|---|---|
| 1: DEVICE WITH CONVENTIONAL STRUCTURE | Ti/Au | — | ZnO | SiO$_2$ | Ti/Au | 2500 | — |
| 2: DEVICE OF PRESENT EMBODIMENT | ITO | SiO$_2$ | ZnO | — | ITO | 9000 | AA |
| 3: DEVICE OF FIRST MODIFIED EXAMPLE | ITO | SiO$_2$ | ZnO | SiO$_2$ | ITO | 9000 | AA |
| 4: DEVICE OF SECOND MODIFIED EXAMPLE | ITO | SiO$_2$ | ZnO | — | Cr/Au | 9000 | AA |
| 5: DEVICE OF THIRD MODIFIED EXAMPLE | ITO | — | ZnO | — | ITO | 3500 | A |
| 6: DEVICE OF FOURTH MODIFIED EXAMPLE | ITO | — | ZnO | SiO$_2$ | ITO | 3500 | A |
| 7: DEVICE OF FIFTH MODIFIED EXAMPLE | Ti/Au | — | ZnO | SiO$_2$ | ITO | 3500 | A |

FIG. 3

VIBRATOR ELEMENT, VIBRATOR, OSCILLATOR, AND ELECTRONIC APPARATUS

BACKGROUND

1. Technical Field

The present invention relates to a vibrator element, and a vibrator, an oscillator, and an electronic apparatus each equipped with the vibrator element.

2. Related Art

In the past, as a vibrator element there has been known a piezoelectric vibrator element (hereinafter referred to as a vibrator element) including a base section, an arm section extending from the base section, and an excitation section supported by a first section of the arm section in a length direction thereof wherein the excitation section has a pair of electrode films sandwiching a piezoelectric film (see, e.g., JP-A-2009-239860 (Document 1)).

The vibrator element of Document 1 has a configuration in which the piezoelectric film of the excitation section (hereinafter referred to as excitation electrodes) extends and contracts to thereby cause a flexural vibration of the arm section (hereinafter referred to as vibration arms) in a thickness direction thereof.

The Q-value (a dimensionless number representing the state of the vibration; the larger the value is, the more stable vibration the value represents) of such a vibrator element as described above is lowered compared to the state in which the vibration arm is stand-alone by providing the excitation electrodes.

As the excitation electrodes of such a vibrator element as described above, there are frequently used films (films each having a foundation layer made of Ti and an upper layer made of Au stacked on each other) made of Ti (titanium)/Au (gold) as the pair of electrode films sandwiching the piezoelectric film.

However, according to an observational study by the inventors, the configuration using Ti/Au as the pair of electrode films of the excitation electrodes has a problem that the degree of deterioration of the Q-value is large.

SUMMARY

An advantage of some aspects of the invention is to provide a solution to at least a part of the problem described above, and the invention can be embodied as the following forms or application examples.

Application Example 1

This application example of the invention is directed to a vibrator element including a substrate including a base section and a vibration arm extending from the base section, a first electrode provided to the vibration arm, a second electrode disposed above the first electrode, and a piezoelectric body disposed between the first electrode and the second electrode, wherein ITO is used as a material of at least one of the first electrode and the second electrode.

According to this application example of the invention, since the vibrator element uses indium tin oxide (ITO; a compound obtained by adding tin oxide to indium oxide at a proportion of a few percent) as at least one of the first electrode and the second electrode (corresponding to a pair of electrode films) provided to the vibration arm, the degradation of the Q-value is suppressed due to the characteristics of ITO, and thus, the Q-value can be improved compared to the related art using Ti/Au.

This fact is derived from the knowledge the inventors have obtained from a result of an analysis based on experiments.

Application Example 2

In the vibrator element of the above application example of the invention, it is preferable that an insulating body disposed between the first electrode and the piezoelectric body is further provided.

According to this application example of the invention, since the vibrator element has the insulating body between the first electrode and the piezoelectric body (corresponding to the piezoelectric film), for example, the orientational characteristics of the piezoelectric body in the polarized state is improved by the insulating body, the degradation of the Q-value is more strongly suppressed, and the Q-value can dramatically be improved compared to the related art using Ti/Au.

It should be noted that the insulating body is preferably in an amorphous (noncrystalline) state.

Application Example 3

In the vibrator element related to Application Example 2 of the invention, it is preferable that $SiO_2$ is used as a material of the insulating body.

According to this application example of the invention, since in the vibrator element $SiO_2$ (silicon dioxide) is used in the insulating body, for example, the orientational characteristics of the piezoelectric body in the polarized state is improved by $SiO_2$, the degradation of the Q-value is more strongly be suppressed, and the Q-value can dramatically be improved compared to the related art using Ti/Au.

Application Example 4

In the vibrator element of the above application example of the invention, it is preferable that ZnO is used as a material of the piezoelectric body.

According to this application example of the invention, since the vibrator element uses ZnO (zinc oxide) as the piezoelectric body, the vibrator element is superior in extension property and contraction property at the time of application of electric field due to the high orientational property thereof, and the substrate can efficiently be vibrated in a flexural manner.

Application Example 5

In the vibrator element of the above application example of the invention, it is preferable that quartz crystal is used as a material of the substrate.

According to this application example of the invention, since the vibrator element uses the quartz crystal as the substrate, it is superior in workability and stable vibration can be obtained irrespective of the variation in ambient temperature due to the characteristics thereof.

Application Example 6

In the vibrator element of the above application example of the invention, it is preferable that silicon is used as a material of the substrate.

According to this application example of the invention, since the vibrator element uses silicon as the substrate, it is possible to make the latent performance (e.g., the Q-value of the substrate as a simple body) related to the Q-value higher than that of the quartz crystal due to the characteristics thereof.

Application Example 7

This application example of the invention is directed to a vibrator including the vibrator element according to any one of the application examples of the invention described above, and a package housing the vibrator element.

According to this application example of the invention, since the vibrator is provided with the vibrator element described in any one of the above application examples of the invention and the package housing the vibrator element, the vibrator providing the advantages described in any one of the above application examples of the invention can be provided.

Application Example 8

This application example of the invention is directed to an oscillator including the vibrator element according to any one of the application examples of the invention described above, and an oscillator circuit adapted to oscillate the vibrator element.

According to this application example of the invention, since the oscillator is provided with the vibrator element described in any one of the above application examples of the invention and the oscillator circuit adapted to oscillate the vibrator element, the oscillator providing the advantages described in any one of the above application examples of the invention can be provided.

Application Example 9

This application example of the invention is directed to an electronic apparatus including the vibrator element according to any one of the application examples of the invention described above.

According to this application example of the invention, since the electronic apparatus is provided with the vibrator element described in any one of the above application examples of the invention, the electronic apparatus providing the advantages described in any one of the above application examples of the invention can be provided.

BRIEF DESCRIPTION OF THE DRAWINGS

The invention will be described with reference to the accompanying drawings, wherein like numbers reference like elements.

FIGS. 1A and 1B are schematic diagrams showing a general configuration of a quartz crystal vibrator element according to a first embodiment of the invention, wherein FIG. 1A is a plan view, and FIG. 1B is a cross-sectional view along the line A-A shown in FIG. 1A.

FIG. 3 is a diagram showing a relationship between materials of the respective constituents of the excitation electrodes and the Q-value in the quartz crystal vibrator element.

FIGS. 4A and 4B are schematic diagrams showing a general configuration of a quartz crystal vibrator element according to a second embodiment of the invention, wherein FIG. 4A is a plan view looked down from a lid (lid body) side, and FIG. 4B is a cross-sectional view along the line C-C shown in FIG. 4A.

FIGS. 5A and 5B are schematic diagrams showing a general configuration of a quartz crystal oscillator according to a third embodiment of the invention, wherein FIG. 5A is a plan view looked down from a lid side, and FIG. 5B is a cross-sectional view along the line C-C shown in FIG. 5A.

DESCRIPTION OF EXEMPLARY EMBODIMENTS

Some embodiments in which the invention is put into practice will hereinafter be explained with reference to the accompanying drawings.

First Embodiment

Here, as an example of a vibrator element, a quartz crystal vibrator element using a quartz crystal as a substrate will be explained.

Figure 1A:
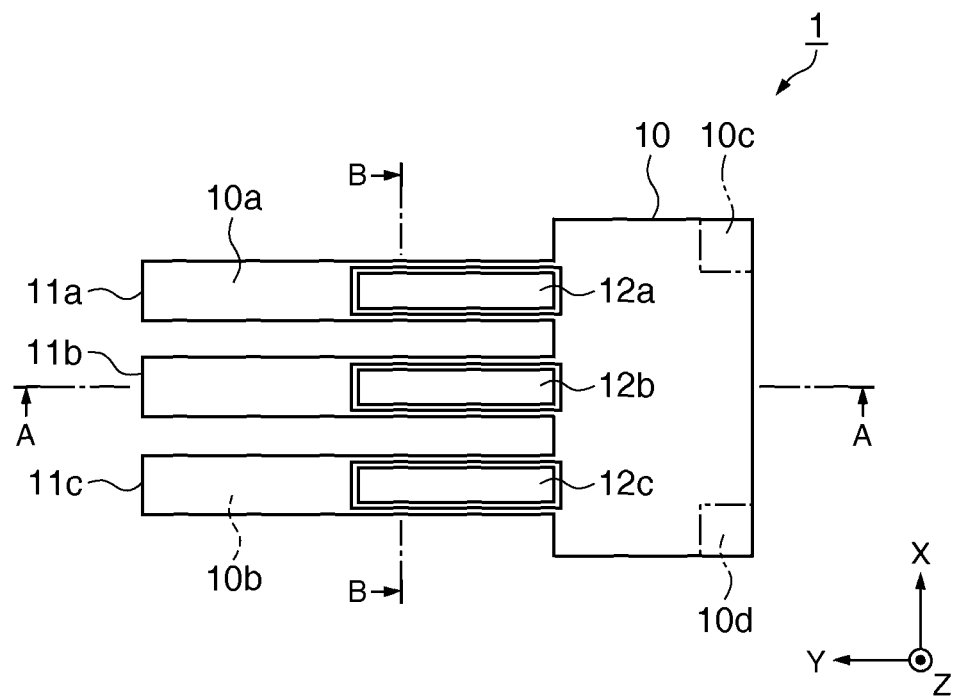
Figure 1B:
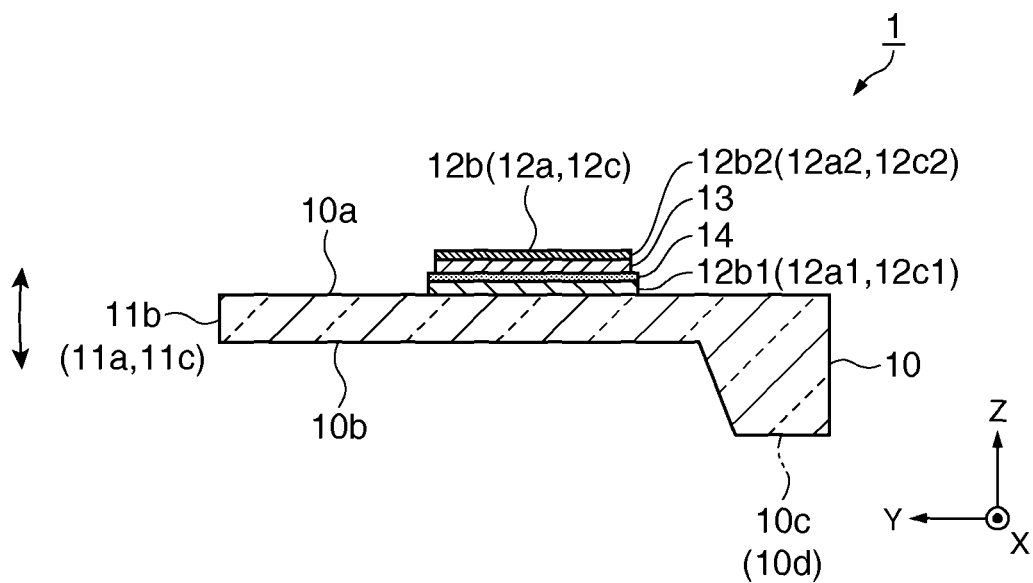

FIGS. 1A and 1B are schematic diagrams showing a general configuration of the quartz crystal vibrator element according to a first embodiment. FIG. 1A is a plan view, and FIG. 1B is a cross-sectional view of FIG. 1A along the line A-A. It should be noted that each wiring is omitted, and the dimensional ratios between the constituents are different from the real ones.

Figure 2:
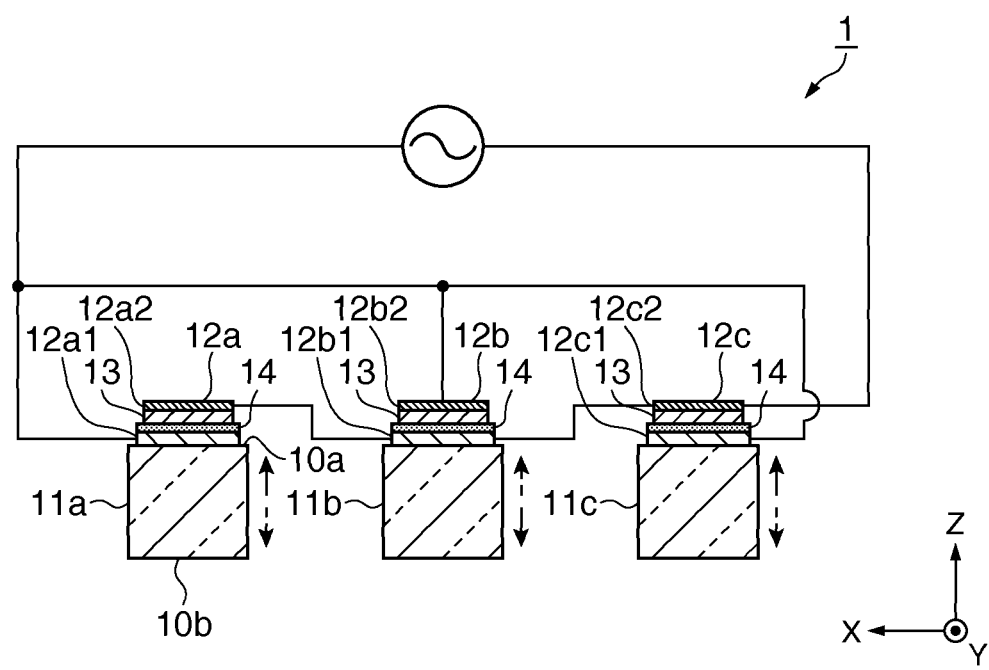
FIG. 2 is a cross-sectional view along the line B-B shown in FIG. 1A, and a wiring diagram of excitation electrodes.

FIG. 2 is a cross-sectional view along the line B-B shown in FIG. 1A, and a wiring diagram of excitation electrodes.

As shown in FIGS. 1A and 1B, the quartz crystal vibrator element 1 is provided with a base section 10 as a substrate, and three vibration arms 11a, 11b, and 11c each extending from the base section 10 in a Y-axis direction of the quartz crystal axis. In the present embodiment, a Z-cut quartz crystal substrate is used as the three vibration arms 11a, 11b, and 11c and the base section 10.

The vibration arms 11a, 11b, and 11c are each formed to have a substantially prismatic shape, arranged in an X-axis direction of the quartz crystal axis perpendicular to the Y-axis direction in a plan view, and respectively provided with excitation electrodes 12a, 12b, and 12c on at least one (here the principal surface 10a) of principal surfaces 10a, 10b thereof along a plane (X-Y plane) specified by the Y-axis direction and the X-axis direction.

The excitation electrodes 12a, 12b, and 12c cause a flexural vibration (an out-of-plane vibration; a vibration in a direction out of the principal surface 10a) of the vibration arms 11a, 11b, and 11c in a Z-axis direction (an arrow direction shown in FIG. 1B) of the quartz crystal axis perpendicular to the principal surface 10a.

The excitation electrodes 12a, 12b, and 12c have laminate structures including first electrodes 12a1, 12b1, and 12c1 disposed on the principal surface 10a side, second electrodes 12a2, 12b2, and 12c2 disposed above the first electrodes 12a1, 12b1, and 12c1, piezoelectric bodies 13 disposed between the first electrodes 12a1, 12b1, and 12c1 and the second electrodes 12a2, 12b2, and 12c2, and insulating bodies 14 disposed between the first electrodes 12a1, 12b1, and 12c1 and the piezoelectric bodies 13, respectively.

Films including ITO are used as the first electrodes 12a1, 12b1, and 12c1, and the second electrodes 12a2, 12b2, and 12c2 of the excitation electrodes 12a, 12b, and 12c, and as the piezoelectric bodies 13 there are used films of a piezoelectric material including ZnO and having a relatively high piezoelectric property (a relatively high orientational property).

Further, as the insulating bodies 14 there are used films including $SiO_2$ in an amorphous state.

It should be noted that it is also possible to use films including ITO as either one of the first electrode 12a1, 12b1, and 12c1, and the second electrode 12a2, 12b2, and 12c2, and use films including other materials (e.g., Ti/Au, Cr (chromium)/Au) as the other thereof.

Further, as the piezoelectric bodies 13, it is also possible to use an piezoelectric material including aluminum nitride (AlN) having substantially the same crystal structure as ZnO.

It should be noted that the excitation electrodes 12a, 12b, and 12c extend from root sections (boundary portions with the base section 10) of the respective vibration arms 11a, 11b, and 11c toward the tip portions, and are preferably disposed with the length a half as long as the entire length (the length along the Y-axis direction from the root to the tip) of the vibration arms 11a, 11b, and 11c.

It should be noted that the base section 10 is formed to have a thickness in the Z-axis direction larger than the thickness of the vibration arms 11a, 11b, and 11c in the Z-axis direction as shown in FIG. 1B.

Further, as indicated by the dashed-two dotted lines in FIG. 1A, on the principal surface 10b side of the base section 10 at the both ends in the X-axis direction, there are disposed fixation sections 10c, 10d as areas for fixing the base section 10 to an external member such as a package. It should be noted that the fixation sections 10c, 10d are preferably disposed at the ends of the base section 10 on the opposite side in the Y-axis direction to the side provided with the vibration arms 11a, 11b, and 11c.

Incidentally, the quartz crystal vibrator element 1 has the constituents formed by an etching process using a photolithographic technique.

Here, as the first electrodes 12a1, 12b1, and 12c1 of the excitation electrodes 12a, 12b, and 12c, there are used films including ITO (hereinafter referred to as ITO films; provided with a light transmission property). Therefore, in the quartz crystal vibrator element 1, the irradiation light applied from the principal surface 10a side of the vibration arms 11a, 11b, and 11c in the exposure process for patterning the resist is transmitted through the ITO film deposited on the principal surface 10a side by sputtering.

There is a possibility that the irradiation light thus transmitted is reflected by tilted surfaces not shown on the principal surface 10b side of the vibration arms 11a, 11b, and 11c provided with the light transmission property similarly to the ITO film, and is then problematically applied to a non-exposure part (the part which should not be exposed when forming the first electrodes 12a1, 12b1, and 12c1) of the resist from the principal surface 10b side.

To cope with this problem, the quartz crystal vibrator element 1 is provided with the device that a molybdenum (Mo) film or an Au film is deposited on the side of the ITO film, which forms the first electrodes 12a1, 12b1, and 12c1, provided with the insulating bodies 14 in a stacked manner in the manufacturing process to thereby block transmission of the irradiation light, and thus normally pattern the resist to thereby form the first electrodes 12a1, 12b1, and 12c1 with predetermined shapes.

It should be noted that in the quartz crystal vibrator element 1, the Mo film or the Au film is used as the film (hereinafter referred to as a light-blocking film) for blocking the transmission of the irradiation light to thereby avoid the electrochemical corrosion prominently occurring in the case of using an aluminum (Al) film as the light-blocking film in the developing process using an alkali developer.

Here, an operation of the quartz crystal element 1 will be explained.

As shown in FIG. 2, the excitation electrodes 12a, 12b, and 12c of the quartz crystal vibrator element 1 have the first electrodes 12a1, 12b1, and 12c1 and the second electrodes 12a2, 12b2, and 12c2 connected to an alternating-current power supply with crossed wiring, and it is arranged that an alternating voltage as a drive voltage is applied thereto.

Specifically, the first electrode 12a1 of the vibration arm 11a, the second electrode 12b2 of the vibration arm 11b, and the first electrode 12c1 of the vibration arm 11c are connected to each other so as to have the same electrical potential, and the second electrode 12a2 of the vibration arm 11a, the first electrode 12b1 of the vibration arm 11b, and the second electrode 12c2 of the vibration arm 11c are connected to each other so as to have the same electrical potential.

When applying the alternating voltage between the first electrodes 12a1, 12b1, and 12c1 and the second electrodes 12a2, 12b2, and 12c2 in this condition, electrical fields are generated between the first electrodes 12a1, 12b1, and 12c1 and the second electrodes 12a2, 12b2, and 12c2 to thereby cause distortion in the piezoelectric bodies 13 due to the inverse piezoelectric effect, and thus the piezoelectric bodies 13 extends and contracts in the Y-axis direction.

The quartz crystal vibrator element 1 is configured so that extension and contraction of the piezoelectric bodies 13 are reversed between the vibration arms 11a, 11c and the vibration arm 11b by setting the directions of the electrical fields generated in the excitation electrodes 12a, 12c and the direction thereof generated in the excitation electrode 12b opposite to each other using the crossed wiring described above.

Specifically, when the piezoelectric bodies 13 of the vibration arms 11a, 11c extend, the piezoelectric body 13 of the vibration arm 11b contracts, and when the piezoelectric bodies 13 of the vibration arms 11a, 11c contract, the piezoelectric body 13 of the vibration arm 11b extends.

In the quartz crystal vibrator element 1, due to the extension and contraction of the piezoelectric bodies 13, the vibration arms 11a, 11b, and 11c bend in the directions of the solid arrows when the alternating voltage takes one electrical potential, and the vibration arms 11a, 11b, and 11c bend in the directions of the dashed arrows when the alternating voltage takes the other electrical potential.

The repeating this process, it results that the vibration arms 11a, 11b, and 11c of the quartz crystal vibrator element 1 flexurally vibrate (the out-of-plane vibration) in the Z-axis direction. On this occasion, the vibration arms (here, the vibration arms 11a, 11b, and the vibration arms 11b, 11c) flexurally vibrate in the respective directions opposite to each other (with reversed phases).

As described above, since in the quartz crystal vibrator element 1 according to the present embodiment, ITO is used in the first electrodes 12a1, 12b1, and 12c1 and the second electrodes 12a2, 12b2, and 12c2 of the excitation electrodes 12a, 12b, and 12c provided to the vibration arms 11a, 11b, and 11c, the degradation of the Q-value is suppressed by the characteristics of ITO, and thus the Q-value can be improved compared to the related art using Ti/Au.

This fact is derived from the knowledge the inventors have obtained from a result of an analysis based on experiments (details thereof will be described later).

Further, since in the quartz crystal vibrator element 1, the excitation electrodes 12a, 12b, and 12c have the insulating bodies 14 between the first electrodes 12a1, 12b1, and 12c1 and the respective piezoelectric bodies 13, due to the insulating bodies 14, for example, the orientational characteristics of the piezoelectric bodies 13 in the polarized state is enhanced, the degradation of the Q-value is more strongly be suppressed, and thus the Q-value can dramatically be improved compared to the related art using Ti/Au.

Further, since in the quartz crystal vibrator element 1 $SiO_2$ is used in the insulating bodies 14, due to the characteristics of $SiO_2$, for example, the orientational characteristics of the piezoelectric bodies 13 in the polarized state is improved, the degradation of the Q-value is more strongly be suppressed, and the Q-value can dramatically be improved compared to the related art using Ti/Au.

In addition, since in the quartz crystal vibrator element 1 $SiO_2$ is used in the insulating bodies 14, it results that, for example, the temperature characteristics provided to $SiO_2$ and the temperature characteristics provided to the first electrodes 12$a$1, 12$b$1, and 12$c$1 and the second electrodes 12$a$2, 12$b$2, and 12$c$2 using ITO are canceled out, and therefore, there is a chance of making it possible to suppress the variation in frequency due to the temperature variation.

Further, since ZnO is used in the piezoelectric bodies 13, the quartz crystal vibrator element 1 is superior in extending and contracting properties in application of an electrical field due to the high orientational property thereof, and it is possible to cause the efficient flexural vibration in the vibration arms 11$a$, 11$b$, and 11$c$.

The fact described above will be explained with reference to the accompanying drawings.

FIG. 3 is a diagram showing a relationship between materials of the respective constituents of the excitation electrodes and the Q-value in the quartz crystal vibrator element. It should be noted that FIG. 3 is obtained by organizing the analysis result of the experiments using the samples of the inventors.

The samples of FIG. 3 have the configurations common in outer sizes and different in materials of the constituents of the excitation electrodes. Further, as the Q-values described therein, the data derived based on the frequency measurement values of the respective samples using a frequency measurement instrument such as a laser Doppler vibrometer.

It should be noted that in FIG. 3 it is assumed that the insulating bodies 14 correspond to an insulating body A, and insulating bodies (not used in the device of the present embodiment) disposed between the piezoelectric bodies 13 and the second electrodes 12$a$2, 12$b$2, and 12$c$2 correspond to an insulating body B for descriptive purposes.

Further, FIG. 3 describes the comparative determination results of the respective samples in the degree of improvement of the Q-value compared to a device (No. 1) with an existing structure in two levels of "A" (good) and "AA" (excellent).

As shown in FIG. 3, in the device with the existing structure of No. 1 based on the related art has the Q-value of 2500.

In contrast, since the device of the present embodiment of No. 2 has the Q-value of 9000, it is understood that the Q-value is dramatically improved compared to the device with the existing structure using Ti/Au in the first electrodes 12$a$1, 12$b$1, and 12$c$1 and the second electrodes 12$a$2, 12$b$2, and 12$c$2.

Further, since a device of a first modified example of No. 3 obtained by adding the insulating body B to the device of the present embodiment has the Q-value of 9000, it is understood that further improvement in the Q-value with respect to the device of the present embodiment is not expected even by adding the insulating body B between the piezoelectric bodies 13 and the second electrodes 12$a$2, 12$b$2, and 12$c$2.

Further, since a device of a second modified example of No. 4 obtained by replacing the second electrodes 12$a$2, 12$b$2, and 12$c$2 of the device of the present embodiment with films (films having a foundation layer made of Cr and an upper layer made of Au stacked on each other) made of Cr/Au has the Q-value of 9000, it is understood that the second electrodes 12$a$2, 12$b$2, and 12$c$2 of the device of the present embodiment are not necessarily required to be formed of ITO films.

Further, since a device of a third modified example of No. 5 obtained by removing the insulating bodies 14 (the insulating body A) from the device of the present embodiment has the Q-value of 3500, it is understood that although the Q-value is improved compared to the device with the existing structure, the insulating bodies 14 are necessary for further improvement of the Q-value.

Further, since a device of a fourth modified example of No. 6 obtained by removing the insulating bodies 14 (the insulating body A) from the device of the present embodiment and adding the insulating body B to the device of the present embodiment has the Q-value of 3500, it is understood that although the Q-value is improved compared to the device with the existing structure, further improvement in the Q-value is not expected even by removing the insulating bodies 14 from the device of the present embodiment and adding the insulating body B between the piezoelectric bodies 13 and the second electrodes 12$a$2, 12$b$2, and 12$c$2.

In other words, it can be said that the fact that it is necessary to dispose the insulating bodies 14 between the first electrodes 12$a$1, 12$b$1, and 12$c$1 and the piezoelectric bodies 13 for further improvement of the Q-value has been confirmed again.

Further, since a device of a fifth modified example of No. 7 obtained by replacing the first electrodes 12$a$1, 12$b$1, and 12$c$1 with the films made of Ti/Au of the related art, removing the insulating bodies 14 (the insulating body A), and adding the insulating body B has the Q-value of 3500, it is understood that the Q-value is improved compared to the device with the existing structure by replacing only the second electrodes 12$a$2, 12$b$2, and 12$c$2 of the device with the existing structure with the ITO films.

According to the result of the samples Nos. 4 and 7, it can be said that it is confirmed that the Q-value of the quartz crystal vibrator element is improved compared to the device with the existing structure by using the ITO films as at least one of the first electrode 12$a$1, 12$b$1, and 12$c$1 and the second electrode 12$a$2, 12$b$2, and 12$c$2.

As described above, according to the analysis result of the experiments using the samples of the inventors, it is confirmed that the quartz crystal vibrator element 1 according to the present embodiment and all of the quartz crystal vibrator elements of the modified examples are improved in the Q-value compared to the quartz crystal vibrator element with the existing structure.

Further, since the fixation sections 10$c$, 10$d$ are disposed at the both ends of the base section 10 in the X-axis direction in the quartz crystal vibrator element 1, it becomes possible to set the path from the vibration arms 11$a$, 11$b$, and 11$c$ to the fixation sections 10$c$, 10$d$ of the base section 10 to be longer compared to the case in which the fixation sections 10$c$, 10$d$ are disposed at other portions.

As a result, in the quartz crystal vibrator element 1, since the vibration energy leaking to an external member via the fixation sections 10$c$, 10$d$ when fixing the fixation sections 10$c$, 10$d$ of the base section 10 to the external member is reduced compared to the case (e.g., the case of disposing the fixation sections 10$c$, 10$d$ in the vicinity of the vibration arms 11$a$, 11$b$, and 11$c$) of disposing the fixation sections 10$c$, 10$d$ in other portions, the degradation of the Q-value can be suppressed.

Further, in the quartz crystal vibrator element 1, since the quartz crystal is used as the substrate, it is superior in workability and stable vibration can be obtained irrespective of the variation in ambient temperature due to the characteristics thereof.

Other Modified Examples

Here, other modified examples of the first embodiment will be explained.

Although in the first embodiment the quartz crystal vibrator element using the quartz crystal as the substrate is explained, a silicon vibrator element using silicon as the substrate can also be adopted as the vibrator element.

The configuration of the silicon vibrator element is basically the same as the configuration of the quartz crystal vibrator element 1 shown in FIGS. 1A, 1B, and 2, but is different from the quartz crystal vibrator element 1 in the quality of the material (the material) of the substrate.

Similar to the quartz crystal vibrator element 1, the silicon vibrator element allows the combinations of the constituents of the excitation electrodes shown in FIG. 3.

It should be noted that in the silicon vibrator element, in the case in which low-resistance silicon such as single-crystal silicon doped with impurities such as phosphorus or boron, or polysilicon is used as silicon, it is preferable to dispose insulating films (insulating bodies) using $SiO_2$ between the principal surfaces 10a of the vibration arms 11a, 11b, and 11c and the first electrodes 12a1, 12b1, and 12c1 shown in FIGS. 1A, 1B, and 2.

Thus, in the silicon vibrator element, the vibration arms 11a, 11b, and 11c and the first electrodes 12a1, 12b1, and 12c1 can reliably be isolated from each other.

As described above, since the silicon vibrator element uses silicon as the substrate, it is possible to increase the latent performance with respect to the Q-value due to the characteristics thereof compared to the quartz crystal vibrator element 1 (e.g., it is possible to increase the Q-value of the substrate as a simple body roughly tenfold).

Further, it is confirmed by the inventors that the suppressive effect of the deterioration of the Q-value in the silicon vibrator element is equivalent to that of the quartz crystal vibrator element 1.

It should be noted that since the silicon vibrator element uses silicon (non-light transmissive material) as the substrate, the light-blocking film for avoiding unwanted exposure in the process of forming the first electrodes 12a1, 12b1, and 12c1, which is required in the quartz crystal vibrator element 1, becomes unnecessary. Thus, the productivity in the manufacturing process can be enhanced with the silicon vibrator element compared to the quartz crystal vibrator element 1.

It should be noted that as the substrate of the vibrator element, a material other than quartz crystal or silicon having the Q-value equivalent to that of quartz crystal or silicon can also be used.

Second Embodiment

Then, a quartz crystal vibrator as a vibrator equipped with the quartz crystal vibrator element described above in the first embodiment will be explained.

Figure 4A:
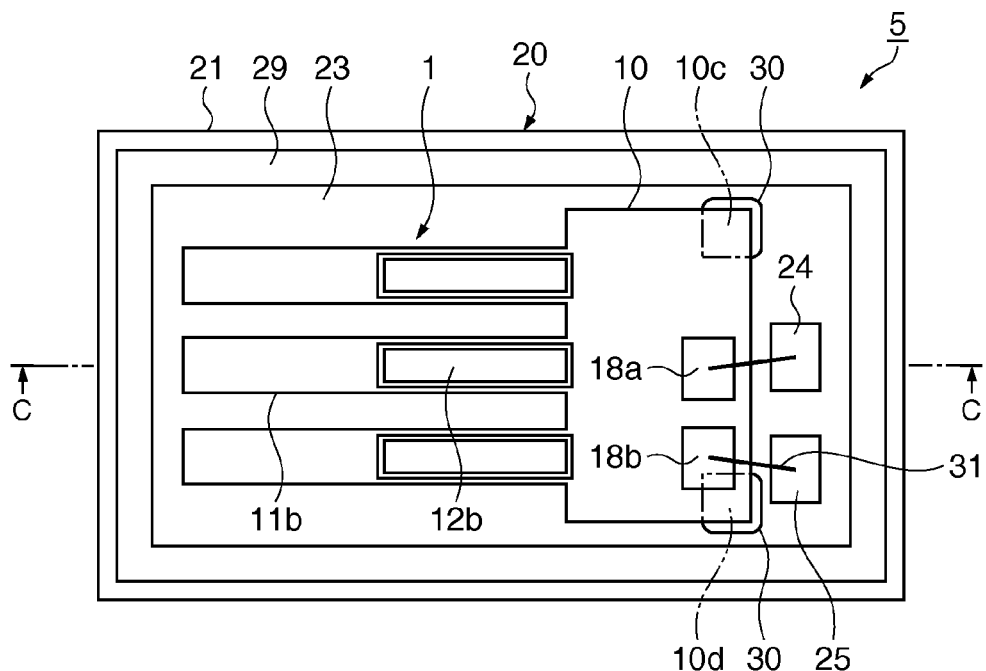
Figure 4B:
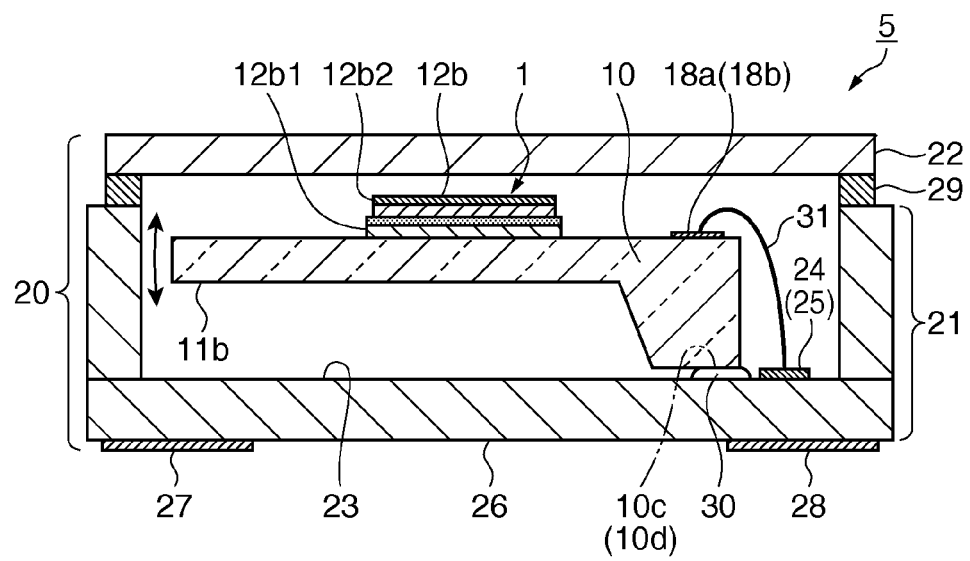

FIGS. 4A and 4B are schematic diagrams showing a general configuration of the quartz crystal vibrator according to the second embodiment. FIG. 4A is a plan view looked down from a lid (lid body) side, and FIG. 4B is a cross-sectional view along the line C-C shown in FIG. 4A. It should be noted that the lid is omitted in the plan view. Further, the wires are also omitted.

It should be noted that the sections common to the first and second embodiments are denoted with the same reference numerals, and the detailed explanation therefor will be omitted, while the sections different from those of the first embodiment described above will mainly be explained.

As shown in FIGS. 4A and 4B, the quartz crystal vibrator 5 is provided with either one (here, the quartz crystal vibrator element 1) of the quartz crystal vibrator element 1 described above in the first embodiment, and the quartz crystal vibrator elements of the respective modified examples, and a package 20 housing the quartz crystal vibrator element 1.

The package 20 has a package base 21 having a roughly rectangular planar shape and provided with a recessed section, and a lid 22 having a roughly rectangular planar shape and shaped like a plate and for covering the recessed section of the package base 21, and is formed to have a roughly rectangular solid shape.

As the package base 21, there is used either one of an aluminum oxide-based sintered body obtained by shaping, stacking, and then calcining the ceramic green sheet, quartz crystal, glass, silicon, and so on.

As the lid 22, there is used the same material as that of the package base 21, or metal such as kovar, 42 Alloy, or stainless steel.

The package base 21 is provided with internal terminals 24, 25 disposed on an inner bottom surface (an inner bottom surface of the recessed section) 23.

The internal terminals 24, 25 are formed at positions adjacent to connection electrodes 18a, 18b provided to the base section 10 of the quartz crystal vibrator element 1 so as to have a roughly rectangular shape. The connecting electrodes 18a, 18b are connected to the first electrodes (e.g., 12b1) and the second electrodes (e.g., 12b2) of the excitation electrodes (e.g., 12b) of the quartz crystal vibrator element 1 with wires not shown.

For example, in the wiring shown in FIG. 2, the wire on one side of the alternating-current power supply is connected to the connection electrode 18a, and the wire on the other side is connected to the connection electrode 18b.

On the outer bottom surface (the surface opposite to the inner bottom surface 23, namely the outer bottom surface) 26 of the package base 21, there are formed a pair of external terminals 27, 28 used when the package is mounted to an external member such as an electronic apparatus.

The external terminals 27, 28 are connected to the internal terminals 24, 25 with internal wires not shown. For example, the external terminal 27 is connected to the internal terminal 24, and the external terminal 28 is connected to the internal terminal 25.

The internal terminals 24, 25 and the external terminals 27, 28 are each formed of a metal film obtained by stacking coated layers respectively made of, for example, nickel (Ni) and Au on a metalization layer made of tungsten (W), Mo, and so on using a process such as plating.

The quartz crystal vibrator 5 has the fixation sections 10c, 10d of the base section 10 of the quartz crystal vibrator element 1 fixed to the inner bottom surface 23 of the package base 21 via an adhesive 30 such as epoxy series, silicone series, or polyimide series.

Further, the quartz crystal vibrator 5 has the connection electrodes 18a, 18b of the quartz crystal vibrator element 1 connected respectively to the internal terminals 24, 25 with metal wires 31 made of, for example, Au or Al.

In the quartz crystal vibrator 5, in the condition in which the quartz crystal vibrator element 1 is connected to the internal terminals 24, 25 of the package base 21, the recessed section of the package base 21 is covered by the lid 22, and the package base 21 and the lid 22 are bonded to each other with a bonding member 29 such as a seam ring, low-melting-point glass, or an adhesive to thereby airtightly seal the inside of the package 20.

It should be noted that the inside of the package 20 is in a condition of reduced pressure (a condition with a high degree of vacuum), or a condition filled with an inert gas such as nitrogen, helium, or argon.

It should be noted that the package can be mainly composed of a plate-like package base and a lid having a recessed section. Further, it is also possible to provide the recessed sections respectively to the package base and the lid of the package.

Further, it is also possible for the base section 10 of the quartz crystal vibrator element 1 to be fixed at a portion other than the fixation sections 10c, 10d, such as a single place in a portion including a center of a straight line connecting the fixation section 10c and the fixation section 10d, instead of the fixation sections 10c, 10d.

According to this configuration, since the quartz crystal vibrator element 1 is fixed at a single place, the distortion of the base section 10 due to the thermal stress caused in the fixation section can be suppressed.

In the quartz crystal vibrator 5, each of the vibration arms (e.g., 11b) of the quartz crystal vibrator element 1 oscillates (resonates) in the thickness direction (the arrow direction shown in FIG. 4B) at a predetermined frequency (e.g., about 32 kHz) in accordance with the drive signal (the alternating voltage) applied to the excitation electrodes (e.g., 12b) via the external terminals 27, 28, the internal terminals 24, 25, the metal wires 31, and the connection electrodes 18a, 18b.

As described above, since the quartz crystal vibrator 5 according to the second embodiment is provided with the quartz crystal vibrator element 1, it is possible to provide the vibrator (e.g., the vibrator capable of suppressing the degradation of the Q-value, and of improving the Q-value compared to the related art) providing the advantages described above in the first embodiment.

It should be noted that it is possible to provide the vibrator providing the advantages substantially the same as described above even in the case in which the quartz crystal vibrator 5 is provided with any one of the quartz crystal vibrator elements of the respective modified examples instead of the quartz crystal vibrator element 1.

Further, it is possible to provide the vibrator providing the advantages substantially the same as described above even in the case in which the quartz crystal vibrator 5 is provided with the silicon vibrator element of another modified example instead of the quartz crystal vibrator element 1 (in this case, the quartz crystal vibrator 5 is changed to the silicon vibrator).

Third Embodiment

Then, a quartz crystal oscillator as an oscillator equipped with the quartz crystal vibrator element described above in the first embodiment will be explained.

Figure 5A:
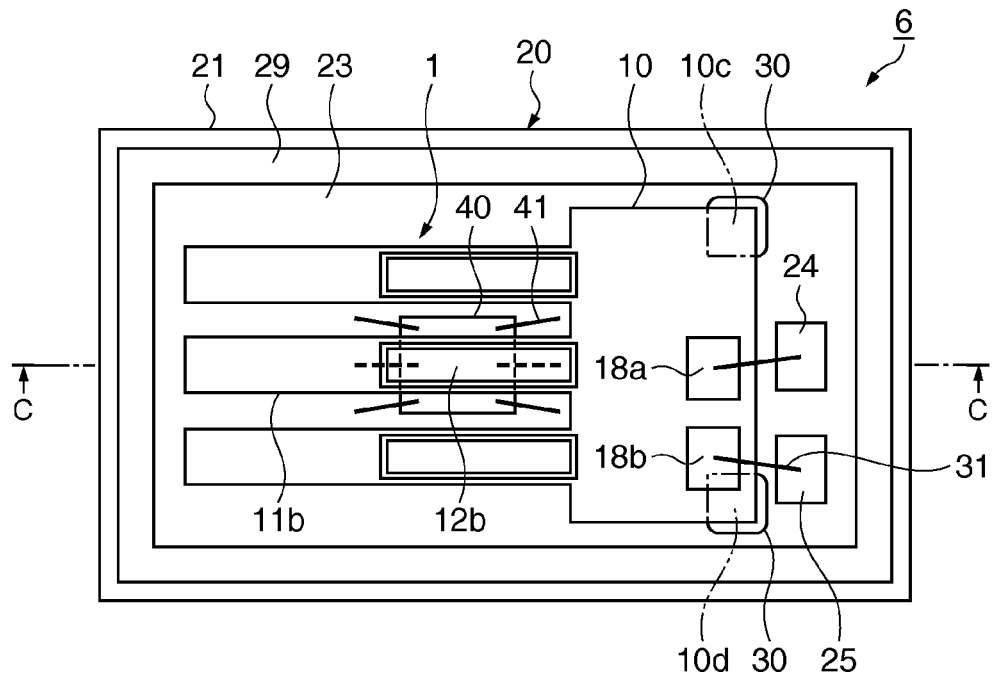
Figure 5B:
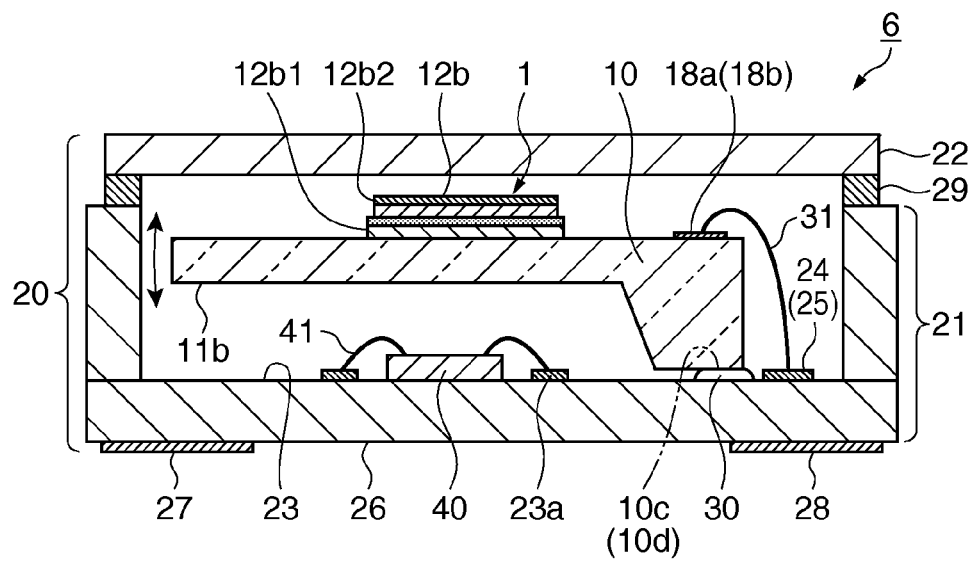

FIGS. 5A and 5B are schematic diagrams showing a general configuration of the quartz crystal oscillator according to a third embodiment. FIG. 5A is a plan view looked down from the lid side, and FIG. 5B is a cross-sectional view along the line C-C shown in FIG. 5A. It should be noted that the lid and some of the constituents are omitted in the plan view. Further, the wires are also omitted.

It should be noted that the sections common to the first through third embodiments are denoted with the same reference numerals, and the explanation therefor will be omitted, while the sections different from those of the first and second embodiments described above will mainly be explained.

As shown in FIGS. 5A and 5B, the quartz crystal oscillator 6 is provided with either one (here, the quartz crystal vibrator element 1) of the quartz crystal vibrator element 1 described above in the first embodiment, and the quartz crystal vibrator elements of the respective modified examples, an IC chip 40 as an oscillator circuit for oscillating the quartz crystal vibrator element 1, and the package 20 housing the quartz crystal vibrator element 1 and the IC chip 40.

On the inner bottom surface 23 of the package base 21, there are disposed internal connection terminals 23a.

The IC chip 40 incorporating the oscillator circuit is fixed to the inner bottom surface 23 using an adhesive or the like not shown.

The IC chip 40 has connection pads not shown connected to the internal connection terminals 23a with metal wires 41 made of, for example, Au or Al.

The internal connection terminals 23a are each formed of a metal film obtained by stacking coated layers respectively made of, for example, Ni and Au on a metalization layer made of W, Mo, and so on using a plating process and so on, and are connected to the external terminals 27, 28, the internal terminals 24, 25 of the package 20 and so on via internal wiring not shown.

It should be noted that it is also possible to use a connection method by the flip-chip mounting with the IC chip 40 flipped, for example, for the connection between the connection pads of the IC chip 40 and the internal connection terminals 23a besides the connection method by wire bonding using the metal wires 41.

In the quartz crystal oscillator 6, each of the vibration arms (e.g., 11b) of the quartz crystal vibrator element 1 oscillates (resonates) at a predetermined frequency (e.g., about 32 kHz) in accordance with the drive signal applied to the excitation electrodes (e.g., 12b) from the IC chip 40 via the internal terminals 24, 25, the metal wires 31, and the connection electrodes 18a, 18b.

Then, the quartz crystal oscillator 6 outputs an oscillation signal generated with the oscillation to the outside via the IC chip 40, the internal connection terminals 23a, the external terminals 27, 28, and so on.

As described above, since the quartz crystal oscillator 6 according to the third embodiment is provided with the quartz crystal vibrator element 1, it is possible to provide the oscillator (e.g., the oscillator capable of suppressing the degradation of the Q-value, and of improving the Q-value compared to the related art) providing the advantages described above in the first embodiment.

It should be noted that it is possible to provide the oscillator providing the advantages substantially the same as described above even in the case in which the quartz crystal oscillator 6 is provided with any one of the quartz crystal vibrator elements of the respective modified examples instead of the quartz crystal vibrator element 1.

It should be noted that it is possible to provide the oscillator providing the advantages substantially the same as described above even in the case in which the quartz crystal oscillator 6 is provided with the silicon vibrator element of another modified example instead of the quartz crystal vibrator element 1 (in this case, the quartz crystal oscillator 6 is changed to the silicon oscillator).

It should be noted that it is also possible for the quartz crystal oscillator 6 (the silicon oscillator) to have a module structure (e.g., a structure in which the quartz crystal vibrator (the silicon vibrator) and the IC chip are separately mounted on a single substrate) having a configuration of not incorporating the IC chip 40 in the package 20 but externally mounting the IC chip 40.

Fourth Embodiment

Then, a cellular phone as an electronic apparatus equipped with the quartz crystal vibrator element described in the first embodiment will be explained.

Figure 6:
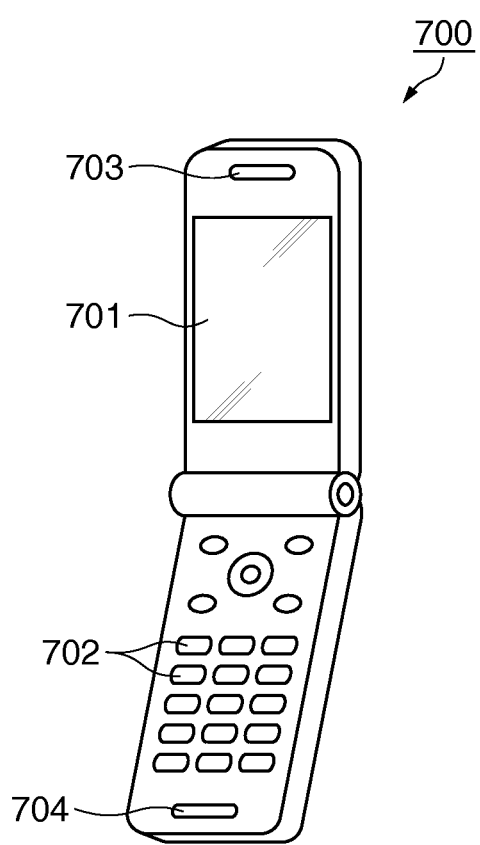
FIG. 6 is a schematic perspective view showing a cellular phone according to a fourth embodiment of the invention.

FIG. 6 is a schematic perspective view showing the cellular phone according to the fourth embodiment.

The cellular phone 700 shown in FIG. 6 is configured including the quartz crystal vibrator element 1 described in the first embodiment as a reference clock oscillation source or the like, and further including a liquid crystal display device 701, a plurality of operation buttons 702, an ear piece 703, and a mouthpiece 704. It should be noted that the cellular phone 700 can also be provided with the quartz crystal vibrator element according to any one of the modified examples or the silicon vibrator element according to another modified example instead of the quartz crystal vibrator element 1.

Either one of the quartz crystal vibrator element 1, the quartz crystal vibrator elements according to the respective modified examples, and the silicon vibrator element according to another modified example can be preferably used as, for example, a reference clock oscillation source of an electronic book, a personal computer, a television set, a digital still camera, a video camera, a video cassette recorder, a car navigation system, a pager, a personal digital assistance, an electric calculator, a word processor, a workstation, a video phone, a POS terminal, a device equipped with a touch panel, and so on besides the cellular phone, and in either case, the electronic device providing the advantages explained in the embodiments and the modified examples described above can be provided.

It should be noted that as the quartz crystal used as the substrate of the quartz crystal vibrator element 1, there can be used a Z-cut plate, an X-cut plate, and so on curved out from a raw stone of the quartz crystal or the like at a predetermined angle. It should be noted that in the case of using the Z-cut plate, etching processing becomes easy due to the characteristics thereof, and in the case of using the X-cut plate, the temperature-frequency characteristics becomes preferable due to the characteristics thereof.

Further, the vibration direction of the vibrator element is not limited to the Z-axis direction (the thickness direction), but can be set to, for example, the X-axis direction (the direction along the principal surface) by disposing the excitation electrodes on the side surfaces (the surface connecting the principal surfaces to each other) of the vibration arms (the flexural vibration in this direction is called an in-plane vibration).

Further, the number of vibration arms of the vibrator element is not limited to three, but can be one, two, four, five, or n (n denotes a natural number equal to or greater than six).

It should be noted that the thickness of the base section of the vibrator element can be set to the same thickness as that of the vibration arms. According to this configuration, since the vibrator element becomes to have a plate-like shape, manufacturing thereof becomes easy.

The entire disclosure of Japanese Patent Application No. 2011-020413, filed on Feb. 2, 2011 and Japanese Patent Application No. 2011-199121, filed on Sep. 13, 2011 are expressly incorporated by reference herein.

What is claimed is:

1. A vibrator element comprising:
   a substrate including a base section and a vibration arm extending from the base section;
   a first electrode provided to the vibration arm;
   a second electrode disposed above the first electrode;
   a piezoelectric body disposed between the first electrode and the second electrode; and
   an insulating body disposed between the first electrode and the piezoelectric body;
   wherein indium tin oxide (ITO) is used as a material of at least one of the first electrode and the second electrode.

2. An electronic apparatus comprising:
   the vibrator element according to claim 1.

3. The vibrator element according to claim 1, wherein $SiO_2$ is used as a material of the insulating body.

4. The vibrator element according to claim 1, wherein ZnO is used as a material of the piezoelectric body.

5. The vibrator element according to claim 1, wherein quartz crystal is used as a material of the substrate.

6. The vibrator element according to claim 1, wherein silicon is used as a material of the substrate.

7. An oscillator comprising:
   the vibrator element according to claim 1; and
   an oscillator circuit adapted to oscillate the vibrator element.

8. A vibrator comprising:
   the vibrator element according to claim 1; and
   a package housing the vibrator element.
   a package housing the vibrator element.

9. A vibrator comprising:
   the vibrator element according to claim 4; and
   a package housing the vibrator element.

10. An oscillator comprising:
    the vibrator element according to claim 4; and
    an oscillator circuit adapted to oscillate the vibrator element.

11. A vibrator comprising:
    the vibrator element according to claim 5; and
    a package housing the vibrator element.

12. An oscillator comprising:
    the vibrator element according to claim 5; and
    an oscillator circuit adapted to oscillate the vibrator element.

13. An electronic apparatus comprising:
    the vibrator element according to claim 5.

14. A vibrator comprising:
    the vibrator element according to claim 6; and
    a package housing the vibrator element.

15. An oscillator comprising:
    the vibrator element according to claim 6; and
    an oscillator circuit adapted to oscillate the vibrator element.

16. An electronic apparatus comprising:
    the vibrator element according to claim 6.

* * * * *